(12) United States Patent
Burroughes et al.

(10) Patent No.: US 6,592,969 B1
(45) Date of Patent: Jul. 15, 2003

(54) FLEXIBLE SUBSTRATES FOR ORGANIC DEVICES

(75) Inventors: Jeremy Henley Burroughes, Cambridge (GB); Peter Devine, Milton (GB)

(73) Assignee: Cambridge Display Technology Limited (GB)

( * ) Notice: Subject to any disclaimer, the term of this patent is extended or adjusted under 35 U.S.C. 154(b) by 0 days.

(21) Appl. No.: 09/283,424

(22) Filed: Apr. 1, 1999

(30) Foreign Application Priority Data

Apr. 2, 1998 (GB) .............................................. 9807149

(51) Int. Cl.[7] .............................. B32B 27/14; B32B 3/00
(52) U.S. Cl. ...................... 428/195; 428/332; 428/426
(58) Field of Search ................................ 428/195, 332, 428/426

(56) References Cited

U.S. PATENT DOCUMENTS

| | | | |
|---|---|---|---|
| 3,777,222 A | * 12/1973 | Harris | 317/112 |
| 4,318,958 A | * 3/1982 | Piatt | 428/332 |
| 4,539,507 A | 9/1985 | Van Slyke et al. | 313/504 |
| 4,600,640 A | 7/1986 | Olson | 428/332 |
| 4,923,288 A | * 5/1990 | Allen et al. | 350/355 |
| 5,247,190 A | 9/1993 | Friend et al. | 257/40 |
| 5,482,896 A | 1/1996 | Tang | 437/209 |
| 6,281,525 B1 | 8/2001 | Krijn et al. | 257/99 |
| 6,287,674 B1 | 9/2001 | Verlinden et al. | 428/210 |
| 6,309,901 B1 | 10/2001 | Tahon et al. | 438/29 |

FOREIGN PATENT DOCUMENTS

| | | | |
|---|---|---|---|
| GB | 1461255 | 1/1977 | |
| WO | WO 00/66507 | 11/2000 | C03C/17/32 |

OTHER PUBLICATIONS

K. Pichler, "Conjugated Polymer Electroluminescence: Technical Aspects From Basic Devices To Commercial Products", Phil. Trans. R. Soc. Lond. A (1997), vol. 355, pp. 829–842.

Patent abstracts of Japan, JP 10106746 A, Apr. 24, 1998.

* cited by examiner

*Primary Examiner*—Cynthia A. Kelly
*Assistant Examiner*—B. Shewareged
(74) *Attorney, Agent, or Firm*—Finnegan, Henderson, Farabow, Garrett & Dunner

(57) ABSTRACT

A transparent or substantially transparent formable and/or flexible component for use as an outer protective element in an electronic or opto electronic device including at least one electrically active organic layer, which component is a composite structure comprising a layer of glass of a thickness less than or equal to 200 microns and a layer of plastic.

10 Claims, 2 Drawing Sheets

FLEXIBLE SUBSTRATES FOR ORGANIC DEVICES

FIELD OF THE INVENTION

This invention relates to flexible substrates for organic devices and particularly but not exclusively to organic light emitting devices (OLEDs) and to OLEDs fabricated on flexible substrates.

BACKGROUND OF THE INVENTION

Organic light-emitting devices such as described in U.S. Pat. No. 5,247,190 or in U.S. Pat. No. 4,539,507, the contents of which are incorporated herein by reference, have great potential for use in various display applications. According to one method, an OLED is fabricated by coating a glass or plastic substrate with a transparent first electrode (anode) such as indium tin oxide (ITO). At least one layer of a thin film of an electroluminescent organic material is then deposited prior to a final layer which is a film of a second electrode (cathode) which is typically a metal or alloy.

The electrode and organic layers used in OLEDs are typically very thin; normally of the order of a few 100 nm and typically around 100 nm and can be flexed without a great risk of damage to the device structure and functioning of the device. By using thin substrates of glass or transparent plastic, formable and/or flexible light sources and displays can be made. For this purpose substrates can be at most a few 100 $\mu$m thick.

In order to fabricate OLEDs which have good operating and shelf life it is of utmost importance to protect the active layers of the device, i.e. the electrode and organic layers, from the ingress of ambient species which can react with the active layer and deteriorate device performance, particularly oxygen and moisture. Typically, but not necessarily, an OLED emits light only from one side and this is typically through the transparent substrate and anode. The cathode is typically opaque and is made of a metal or alloy. This opaque side is relatively easy to encapsulate against the ingress of ambient reactive species as, for example, pinhole-free metal foils or metallised plastic foils can be used by, for example, lamination to the cathode.

For OLEDs fabricated on glass substrates the glass itself provides an excellent barrier against the ingress of oxygen and moisture. However, for OLEDs fabricated on transparent plastic foils it is extremely difficult to encapsulate the transparent side against the ingress of ambient reactive species. The oxygen and water permeabilities of even the most impermeable transparent plastic substrates (thin films) presently available are too high to be sufficient as a barrier for long life OLED devices. A simple estimate for this is given for example in K. Pichler, Phil. Trans. R. Soc. Lond. A (1997), Vol. 355, pp 829–842. This situation can be greatly improved by the conductive transparent coating itself, typically an inorganic conductive oxide such as indium tin oxide (ITO). Such ITO coatings on the thin plastic substrates can be very good barriers against the ingress of oxygen and water from outside into the device, as long as the ITO coatings are pinhole-free and defect free. However, these thin ITO (or other conductive oxide coatings) deposited onto thin flexible plastic substrates are prone to "cracking" if the substrates are not handled with the greatest care. The occurrence of such cracks in the ITO coating creates highly efficient diffusion channels for the ingress of ambient reactive species, just as pinholes in the coating would do. In addition to that, such cracks in the ITO coating may also result in an undesired deterioration of the surface flatness of the coating. This requirement to avoid cracking of the ITO coating puts severe constraints on the handling of the substrates and devices and hence the manufacturing process.

Alternatively, the use as an OLED substrate of thin formable and/or flexible glass with thicknesses of less than 200 $\mu$m is possible and even only 30 $\mu$m thick flexible glass, which is available commercially, is impermeable to oxygen and water and thus provides excellent barrier properties together with high transparency. Such thin glass is currently available from, for example, DESAG AG, Germany. However, such thin glass, although of a composition and specially manufactured to reduce brittleness, is still extremely difficult to handle and can very easily break if not handled with the greatest care. This puts severe limitations on the use of thin flexible glass as substrates for OLEDs due to the difficulty of manufacturing.

SUMMARY OF THE INVENTION

It is an aim of the present invention to provide an improved substrate for an electronic or optoelectronic device including at least one electrically active organic layer, which avoids or at least reduces the problems of the prior art.

According to one aspect of the present invention there is provided a transparent or substantially transparent formable and/or flexible component for use as an outer protective element in such an organic device, which component is a composite structure comprising a layer of glass of a thickness $\leq 200$ $\mu$m and a layer of plastic. In this connection the formability of the component allows it to deviate from full planarity by bending and/or twisting so it can adapt to the shape or form of some other object. Its flexibility allows it to be bent without detrimentally affecting its barrier properties.

The invention is particularly but not exclusively concerned with an organic light-emitting device. Such a device comprises a first charge injecting electrode for injecting charge carriers of a first type and a second charge injecting electrode for injecting charge carriers of a second type. Between the first and second electrodes is arranged at least one layer of a thin film of an electroluminescent organic material. When an electric field is applied across the device, charge carriers injected into the material by the first and second electrodes recombine and decay radiatively causing light to be emitted from the electroluminescent layer. In the present description, the first electrode is referred to herein as the anode and the second electrode is referred to herein as the cathode.

Other organic devices include thin film transistors (TFTs), diodes, photodiodes, triodes, photovoltaic cells and photo-couplers.

The outer protective element can constitute a substrate for the organic device and, as such, can be coated with a transparent electrode layer. That layer would normally be the anode and is preferably of indium tin oxide. In that case, the electrode coating is applied to one surface of the glass layer so that the plastic layer, adjacent the other surface of the glass layer, forms the outer layer of the protective element. As an alternative, the outer protective element constitutes an encapsulation film for a preformed organic light-emitting device.

In order to form the structure in which the outer protective element constitutes a substrate for the organic light-emitting device, the glass layer may be precoated with a transparent electrode layer prior to attachment to the plastic layer, or the transparent electrode layer may be deposited after fabrication of the composite structure. It is also possible to reverse the order of layers in the composite structure so that the plastic layer constitutes the inner layer carrying the electrode layer and the outer layer constitutes the glass layer.

The organic device with the outer protective element can be manufactured in a sequence of integrated steps which include the construction of the composite structure, deposition of the transparent electrode layer, deposition of the or each organic electrically active layer and deposition of the second electrode layer. A batch, semi-continuous or continuous process can be considered for the manufacture of the complete device. A further encapsulation layer on the second electrode layer can be provided.

Various manufacturing techniques are possible in accordance with different embodiments of the present invention.

According to one embodiment, a plastic layer carrying a coating of a first transparent electrode (e.g. ITO) is provided. Then, at least one layer of an electrically active, e.g. electroluminescent, organic material is deposited followed by the second electrode layer. The complete structure is then laminated to the glass layer.

According to another embodiment, the plastic and glass layers are exchanged in the preceding sequence.

According to a further embodiment, the composite structure is prefabricated and is then used as the basis for deposition of the first electrode layer, the at least one layer of an electrically active organic material and the second electrode layer.

If the glass layer is used as the "outer layer", that is with the plastic layer adjacent the first electrode layer and within the glass layer, it is important to remove (for example by out-gassing, baking-out or pumping-out) impurities (for example oxygen, water and possible other low molecular weight compounds) which may be present in the substrate.

Preferably, the glass layer is less than 100 $\mu$m thick and better still around or less than 50 $\mu$m thick.

Preferably, the plastic layer is less than or around 1 mm thick and preferably less than or around 500 $\mu$m thick and better still less than or around 200 $\mu$m thick.

The glass and plastic layers can be provided in sheet form according to a batch process.

Alternatively, the glass layer can be provided in sheet form and the plastic layer from a continuous roll.

As a further possibility, both glass and plastic layers are from continuous rolls.

The composite structure can be formed by lamination of the glass and plastic layers, e.g. according to a batch process, a continuous roll-to-roll process or a semi-continuous process whereby the plastic layer is a continuous film and the glass layer is in sheet form.

The plastic layer can be of e.g. polyesters, polycarbonate, polyvinylbuterate, polyethylene and substituted polyethylenes, polyhydroxybutyrates, polyhydroxyvinylbutyrates, polyetherimides, polyamides, polyethylenenaphalate, polyamides, polyethers, polysulphones, polyvinylacetylenes, transparent thermoplastics, transparent polybutadienes, polycyanoacrylates, cellulose-based polymers, polyacrylates and polymethacrylates, polyvinylalcohol, polysulphides and polysiloxanes.

It is also possible to use polymers which can be deposited/coated as pre-polymers or pre-compounds and then converted, such as epoxy-resins, polyurethanes, phenol-formaldehyde resins, and melamine-formaldehyde resins.

The lamination of the glass and plastic layers can be with glue/adhesive in between the two layers. In that case, glue can be pre-coated onto one of the two or on both substrates; or supplied during the lamination process, at room or elevated temperature and with or without pressure. UV-cured glues are also suitable.

The plastic layer can be from Aclam™ or other similar plastic sheets which are pre-coated with a heat-seal glue.

Lamination and/or deposition of the plastic layer onto the glass layer can be integrated in the fabrication process of the glass, i.e. glass comes off the fabrication line and is then (still hot or warm or cold) coated with the plastic.

As an alternative to formation by lamination, the plastic layer of the composite is coated onto the glass layer by a batch or continuous process. Coating of the plastic onto the glass can be by dip, spray, solution-spin, solution-blade, meniscus coating, or by coating of a molten plastic onto the glass layer.

That is, it is possible to consider the different situations (i) where plastic exists already as film and is laminated to the glass and (ii) where plastic is not in film form but is coated onto the glass by dip, spray, etc. etc. The pre-polymers mentioned above, for example, are amenable to case (ii). However, also several of the other plastics mentioned above can be coated for case (ii). In this instance the polymers can be coated onto the glass principally by: coating from solution, from a melt or as pre-polymer.

The invention also provides an organic device comprising:

a flexible and/or formable composite structure comprising a layer of glass of thickness $\leq 200$ $\mu$m and a layer of plastic;

a transparent or substantially transparent first electrode layer overlying the composite structure;

at least one layer of an electrically active organic material overlying the first electrode layer; and a second electrode layer overlying the layer(s) of organic material.

In one embodiment, the electrically active organic material is electroluminescent.

The composite structure finds use as a substrate/encapsulant not only for OLEDs (small molecule fluorescence (SMF) and (LEP) light emitting polymers) but for other devices including at least one electrically active organic layer e.g. organic photo-detectors, organic solar-cells, thin-film-transistor (TFT) arrays and TFTs for OLEDs. The preferred use is for LEP products such as un-patterned backlights and other light sources or patterned devices such as signs, alpha-numeric displays or dot-matrix and other high-resolution displays. In particular, a preferred light-emitting polymer is a semiconductive conjugated polymer of the type discussed in the earlier referenced US patents.

It is often the case that the problems with handling thin glass arise from picking up glass sheets at the edges where a crack can start very easily. In order to avoid this, one embodiment of the present invention provides that the plastic layer extends beyond the edges of the glass layer in the composite so that the plastic part only can be used to pick up the composite structure. This reduces cracking possibilities and keeps the glass layer untouched.

The plastic "excess" can be all around the glass substrate, at one edge or at any of a number of edges.

In manufacture of an organic light-emitting device, it is usually necessary to subject some or all of the layers to processing steps. For example, if the electroluminescent organic material is a semiconductive conjugated polymer such as poly(phenylene vinylene) (PPV) then the deposition of that layer would normally take place by depositing a precursor to the polymer in a solvent, for example by spin-coating, and then subjecting that layer to a subsequent processing step to convert the precursor to the final polymer. Thus, the underlying composite structure, if present during these processing steps, must be able to withstand the solvents used for spin-coating the precursor layer and the subsequent temperatures used for driving off the solvent and converting the precursor to the polymer. Thus, the plastic layer of the composite structure needs to be of appropriate qualities. For example, if the composite structure is to be subjected to high temperatures, then the glass-transition temperature of the plastic layer should be above those temperatures. For example, a temperature of in excess of 150° C. is possible. Moreover, the plastic layer should be resistant to the solvent layers used for the polymers, such as mixed xylene, THF, used for soluble conjugated polymers such as MEH PPV.

The composite structure can comprise more than two layers. For example, the composite structure can comprise a glass layer and two plastic layers.

In particular, a composite structure can comprise a plastic/glass/plastic composite with a coating of ITO on the outer surface of one of the plastic layers. Such a structure would be preferred in a situation where there was a significant difference in the expansion coefficients of the glass layer and plastic layer, such that a bending of the composite structure may take part. This would be prevented if an additional layer was incorporated.

Additional functionality can be incorporated into the plastic layer. For example, the plastic layer can comprise a plastic polariser sheet, a contrast-enhancing filter-laminate, have anti-reflective properties, colour filter properties or colour conversion properties. For example, it would be possible to have a device in which the light emitting layer emits blue light and in which the laminate contains, for example, red or green fluorescent molecules which absorb the blue and re-emit in the red or green. Alternatively or additionally, the plastic layer can be designed to block undesired ambient light and/or have scattering particles so that wave guiding is reduced and the brightness of the device is increased. Where possible, such additional functionalities could be incorporated in the glass layer. Where a third plastic layer is provided in the composite structure, this allows the possibility of two different types of plastic layers, providing the possibility for incorporating different additional functionalities into the different layers.

The present application thus describes transparent substrates and encapsulation films for use in organic devices which avoids or at least reduces the problems of prior art and provides substrates and films which have both good transparency and good barrier properties and which can also be handled without great risk of deteriorating the continuity of the substrate and its barrier properties.

BRIEF DESCRIPTION OF THE DRAWINGS

For a better understanding of the present invention and to show how the same may be carried into effect reference will now be made by way of example to the accompanying drawings in which.

DETAILED DESCRIPTION

Figure 1:
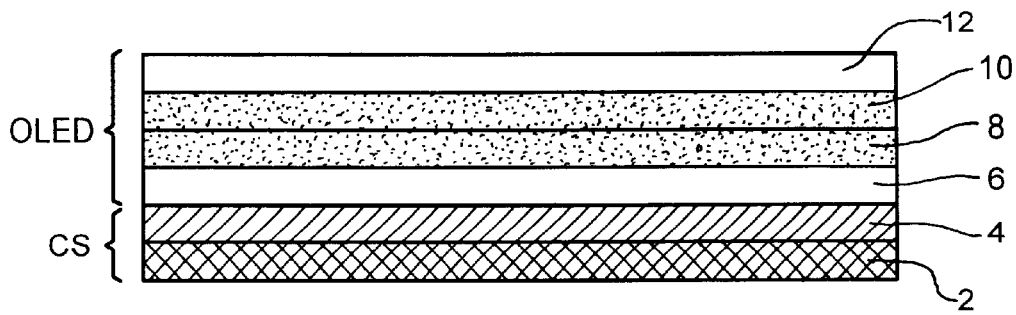
FIG. 1 is a diagrammatic sectional view of a device in accordance with one embodiment of the invention.

FIG. 1 illustrates an organic light-emitting device with a composite structure as its substrate. In FIG. 1, OLED is used to denote the organic light-emitting device and CS is used to denote the composite structure. The composite structure comprises a plastic layer 2 and a glass layer 4. The organic light-emitting device OLED comprises a first electrode layer 6, in this case an anode formed of indium tin oxide, a first thin film of an organic light emissive material 8 (in this case PPV), a second thin film of an organic material 10 (e.g. MEHPPV, and a second electrode layer 12 in this case a cathode, for example of a calcium layer capped by an aluminium layer. The second layer of organic material can be a light-emissive layer or a charge transport layer or have some other purpose. Further organic light-emissive layers can be provided.

As an alternative to the arrangement described above, layer 8 could be a charge transport layer such as polyethylenedioxythiophene doped with polystyrene sulphonic acid (PEDT: PSS), polyaniline or PPV, while the second thin film layer 10 may be the light-emissive layer such as a blend of 5% poly(2,7-(9,9-di-n-octylfluorene)-3,6-(benzothiadiazole) with 95% poly(2,7-(9,9-di-n-octylfluorene) (5F8BT), poly(2,7-(9,9-di-n-octylfluorene) (F8), poly(2,7-(9,9-di-n-octylfluorene)-(1,4-phenylene-((4-methylphenyl) imino)-1,4-phenylene-((4-methylphenyl) imino)-1,4-phenylene))/poly(2,7-(9,9-di-n-octylfluorene) (PFM:F8), poly(2,7-(9,9-di-n-octylfluorene)-(1,4-phenylene-((4-methoxyphenyl)imino)-1,4-phenylene-((4-methoxyphenyl)imino)-1,4-phenylene))/poly(2,7-(9,9-di-n-octylfluorene)/poly(2,7-(9,9-di-n-octylfluorene)-(1,4-phenylene-((4-secbutylphenyl)imino)-1,4-phenylene)) (PFMO:F8:TFB).

The layer 12 forming the cathode can, for example, be a metallic element or alloy with a work function of typically less than or around 3.5 eV or preferably even less than or around 3 eV. Examples are Ca, Ba, Li, Sm, Yb, Tb, etc or alloys of Al, Ag or others with low work function elements such as Ca, Ba, Li, Sm, Yb, Tb, etc.

According to one method of construction, the device of FIG. 1 is constructed by first forming the composite structure CS. Thus, a laminate comprising the plastic layer 2 and glass layer 4 is first formed and then used as a substrate for deposition of the indium tin oxide layer 6 on top of the inner surface of the glass layer 4. The composite structure comprising the plastic layer 2 and glass layer 4 is first formed by laminating together a plastic sheet and a glass sheet. The glass sheet preferably has a thickness of around 200 μm and the plastic sheet has a thickness of around 200 μm. After formation of the composite structure CS, a layer of indium tin oxide 6 is deposited on the inner surface of the glass layer 4. Subsequently, an electroluminescent layer of poly (phenylene vinylene) (PPV) is deposited by spin-coating a precursor to PPV in a suitable solvent onto the ITO layer 6 and then heating the spin-coated layer to convert the precursor to the polymer PPV. A subsequent electroluminescent layer or charge transport layer 10 is put down in a similar fashion. Finally, a layer of Ca is evaporated followed by the evaporation of an Al capping layer. Alternatively, these layers could be deposited by sputtering, sequentially or by sputtering a Ca/Al alloy directly.

According to another embodiment of the invention, the structure of FIG. 1 is formed by a process in which the sequence of steps is varied. Prior to forming the composite structure CS, the layer of glass 4 is coated on its surface with a layer of indium tin oxide 6 and, after that process, the plastic layer 2 is laminated to the underside of the glass layer 4. Subsequent steps for manufacture of the device are as described above with reference to the first embodiment.

Figure 2:
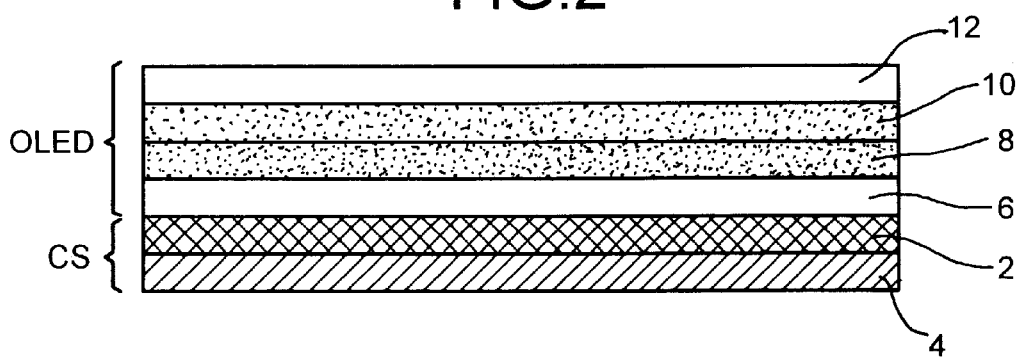
FIG. 2 is a diagrammatic sectional view of a device in accordance with another embodiment of the present invention.

FIG. 2 represents a different structure in accordance with the invention. In that structure, the composite structure still comprises a layer of plastic 2 and a layer of glass 4, but these layers are now positioned with the glass layer being the outer layer of the device and the plastic layer being the inner layer. In other respects, the construction of the device is as described earlier with reference to FIG. 1. Similarly, the device can be manufactured as already mentioned.

Figure 3:
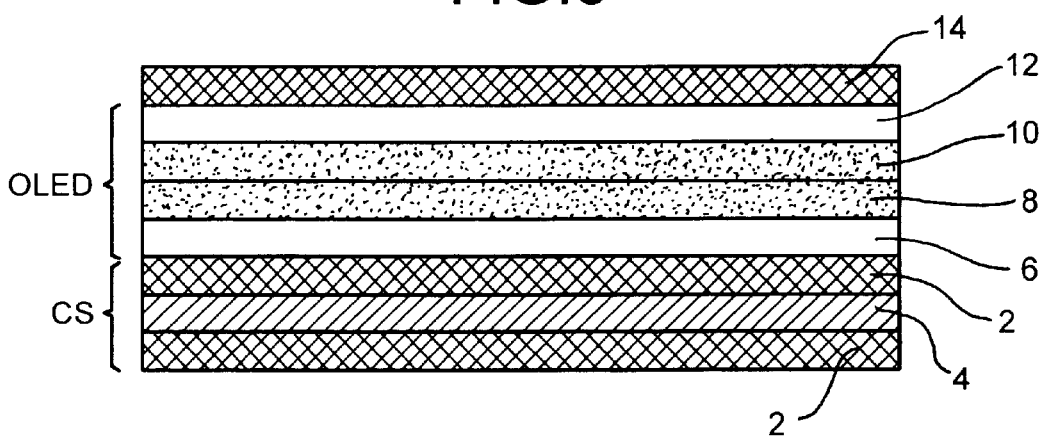
FIG. 3 is a diagrammatic sectional view of a device in accordance with a further embodiment of the present invention.

FIG. 3 illustrates a further different structure according to another embodiment of the invention. In the structure of FIG. 3, the composite structure comprises three layers, consisting of two plastic layers 2 and an intermediate glass layer 4. Manufacture of the device according to FIG. 3 can be according to any of the preceding methods, that is by preformation of the composite structure and subsequent deposition of the organic light-emitting device layers, or by some intermediate coating step and subsequent laminating steps to form the composite structure.

The structure of FIG. 3 also includes an upper encapsulation layer 14 which encloses the cathode layer 12. The upper encapsulation layer 14 can similarly be used in the embodiments of FIGS. 1 and 2. The upper encapsulation layer 14 can be of the type already mentioned or can be a film/composite which has metal as the dominant barrier film, e.g. a metal foil or metal covered plastic foil.

Figure 4:
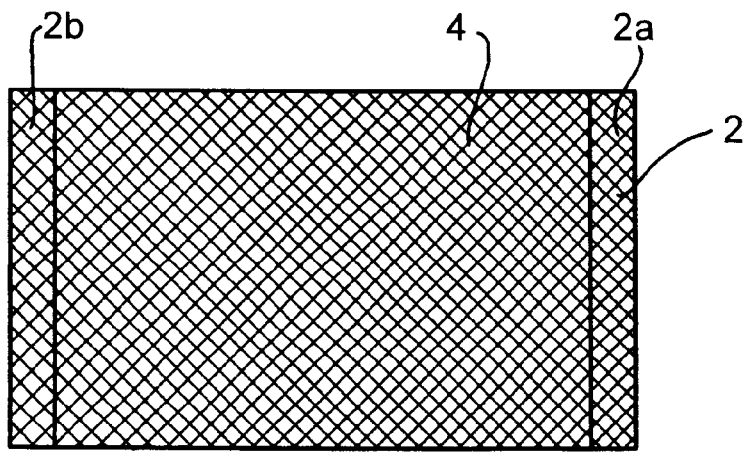
FIG. 4 is a plan view of a device in accordance with yet another embodiment of the invention.

FIG. 4 illustrates a view looking down on the device, in which the plastic layer 2 of the composite extends slightly beyond the glass layer 4. This provides plastic strips 2a, 2a which allow the device to be picked up thus reducing the likelihood of cracking the glass layer.

Figure 5:
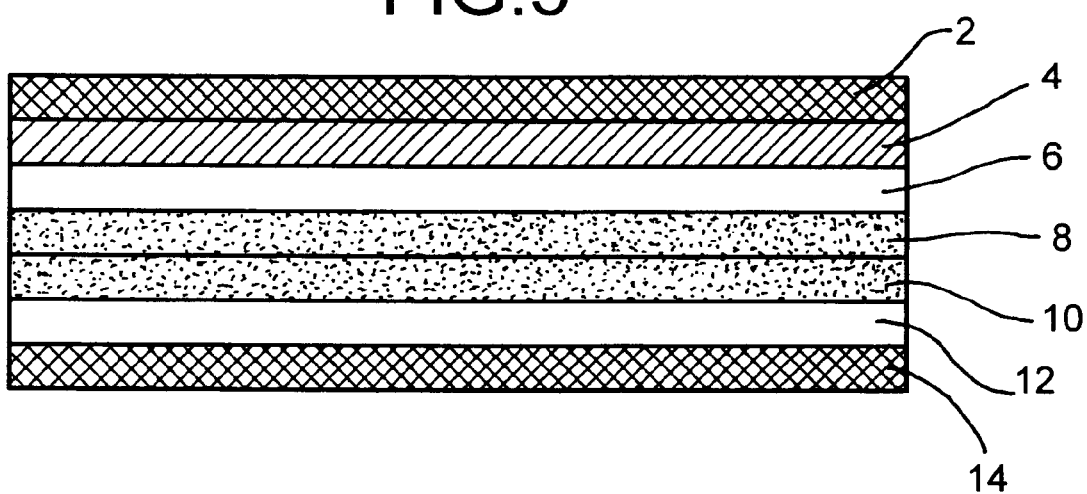
FIG. 5 is a diagrammatic sectional view of a "reverse" structure.

FIG. 5 illustrates a device structure which has been fabricated in "reverse" order. That is, a metal encapsulation layer 14 forms the basis for deposition of the subsequent layers. In FIG. 5, like numerals denote like layers as in FIGS. 1 to 3.

The lower encapsulation layer 14 can be replaced by an encapsulation layer having the following structures:

1. a composite of a plastic layer and a metal layer;

2. a composite of a plastic layer, a thin glass layer and a metal layer;

3. a composite of a thin glass layer and a metal layer.

The upper polymer layer 8 in FIG. 5 can be a conducting polymer such as PEDT:PSS constituting a charge transport layer. It is possible to manufacture the device of FIG. 5 by precoating a composite structure of a thin glass layer 4 and plastic layer 2 with a layer of ITO 6 and a layer of conducting polymer. That composite can then be laminated to a preformed structure comprising the metal layer 14, cathode layer 12 and polymer layer 10.

What is claimed is:

1. A transparent or substantially transparent formable and/or flexible component comprising:
   a composite structure comprising a layer of glass of thickness $\leq 200$ μm and a layer of plastic, the component being for use as an outer protective element in a flexible organic electronic or optoelectronic device comprising:
      a transparent or substantially transparent first electrode layer overlying the composite structure;
      at least one layer of an electrically active organic material overlying the first electrode layer; and
      a second electrode layer overlying the layer(s) of organic material.

2. A component according to claim 1, wherein the glass layer is less than 100 μm thick.

3. A component according to claim 1, wherein the plastic layer has a thickness of $\leq 1$ mm.

4. A component according to claim 1, which comprises an adhesive layer between the glass and plastic layers.

5. A component according to claim 1, which comprises a further plastic layer such that the layer of glass lies between two layers of plastic.

6. A component according to claim 1, wherein at least one of the layers of the composite structure comprises an additive for altering the light behavioral properties of the component.

7. A component according to claim 1, wherein the glass layer is less than 50 μm thick.

8. A component according to claim 1, wherein the plastic layer has a thickness of $\leq 200$ μm.

9. A transparent or substantially transparent component comprising:
   a composite structure comprising a layer of glass of thickness $\leq 200$ μm and a layer of plastic, the component being for use as an outer protective element in an electronic or optoelectronic device comprising:
      a transparent or substantially transparent first electrode layer overlying the composite structure;
      at least one layer of an electrically active organic material overlying the first electrode layer; and
      a second electrode layer overlying the layer(s) of organic material;
      an additional layer of plastic such that the layer of glass lies between two layers of plastic.

10. A transparent or substantially transparent component comprising:
   a composite structure comprising a layer of glass of thickness $\leq 200$ μm and a layer of plastic, the component being for use as an outer protective element in an electronic or optoelectronic device comprising:
      a transparent or substantially transparent first electrode layer overlying the composite structure;
      at least one layer of an electrically active organic material overlying the first electrode layer; and
      a second electrode layer overlying the layer(s) of organic material;
      a further encapsulation layer adjacent the second electrode layer.

* * * * *